US009312262B2

United States Patent
Lee

(10) Patent No.: US 9,312,262 B2
(45) Date of Patent: Apr. 12, 2016

(54) DYNAMIC RANDOM ACCESS MEMORY UNIT AND FABRICATION METHOD THEREOF

(71) Applicant: INOTERA MEMORIES, INC., Taoyuan County (TW)

(72) Inventor: Tzung-Han Lee, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 86 days.

(21) Appl. No.: 14/256,033

(22) Filed: Apr. 18, 2014

(65) Prior Publication Data

US 2015/0214231 A1    Jul. 30, 2015

(30) Foreign Application Priority Data

Jan. 29, 2014 (TW) .............................. 103103492 A

(51) Int. Cl.
*H01L 27/00*    (2006.01)
*H01L 27/108*    (2006.01)
*H01L 29/78*    (2006.01)
*H01L 21/762*    (2006.01)

(52) U.S. Cl.
CPC .... *H01L 27/10823* (2013.01); *H01L 21/76224* (2013.01); *H01L 27/1087* (2013.01); *H01L 27/10814* (2013.01); *H01L 27/10817* (2013.01); *H01L 27/10835* (2013.01); *H01L 27/10841* (2013.01); *H01L 27/10855* (2013.01); *H01L 27/10864* (2013.01); *H01L 27/10867* (2013.01); *H01L 27/10876* (2013.01); *H01L 27/10885* (2013.01); *H01L 29/7827* (2013.01)

(58) Field of Classification Search
CPC ................... H01L 27/10823; H01L 27/10814; H01L 27/10817; H01L 27/10835; H01L 27/10885; H01L 27/10855; H01L 27/10864; H01L 27/10867; H01L 27/1087; H01L 27/10876; H01L 27/10841; H01L 29/7827; H01L 21/76224

See application file for complete search history.

(56) References Cited

U.S. PATENT DOCUMENTS

| | | | |
|---|---|---|---|
| 2009/0001513 A1* | 1/2009 | Lee | H01L 27/10891 257/532 |
| 2010/0117132 A1* | 5/2010 | Chou | H01L 29/66181 257/302 |
| 2010/0208537 A1 | 8/2010 | Pelley, III et al. | |
| 2011/0111573 A1* | 5/2011 | Wang | H01L 21/31144 438/396 |
| 2011/0260230 A1* | 10/2011 | Lee | H01L 21/26586 257/306 |
| 2012/0250438 A1 | 10/2012 | Liu et al. | |
| 2013/0016561 A1* | 1/2013 | Nam | H01L 27/11556 365/185.11 |

FOREIGN PATENT DOCUMENTS

TW    201037706 A    10/2010
TW    201322255 A    6/2013

* cited by examiner

*Primary Examiner* — Caleb Henry
*Assistant Examiner* — Alexander Belousov
(74) *Attorney, Agent, or Firm* — Rosenberg, Klein & Lee

(57) ABSTRACT

A dynamic random access memory unit includes a substrate having a trench disposed therein, a self-aligned trench isolation structure formed in the bottom portion of the trench, and a first trenched gate formed in the bottom portion of the trench and above the self-aligned trench isolation structure. The substrate includes at least one pillar-shaped active body having a drain region, a body region atop the drain region, and a source region atop the body region. The first trenched gate includes a first spacer formed on the side-wall in the bottom portion of the trench to selectively cover and surround the portion of the side-wall in the trench that comprises the drain region, such for defining the width of the self-aligned trench isolation structure.

9 Claims, 12 Drawing Sheets

DYNAMIC RANDOM ACCESS MEMORY UNIT AND FABRICATION METHOD THEREOF

BACKGROUND

1. Field of the Invention

The instant disclosure relates to structural arrangement of semiconductor electronic device and fabrication method thereof, and pertains particularly to a semiconductor device having self-aligned trench isolation structure and fabrication method thereof.

2. Description of Related Art

Dynamic Random Access Memory (DRAM) is among the most frequently encountered semiconductor electronic devices today. A DRAM is a type of data storage device that stores bit data in the form of electrical charge in the capacitors thereof. As modern electronic product evolves along the trend of light device-weight and low-physical profile, higher degree of integration and device density of DRAM device becomes a necessary requirement in the effort to achieve further degree of device miniaturization. DRAM, being one of the most commonly used volatile memory device, comprises a plurality of memory cell units. The data/information stored in each memory cell unit of a DRAM is accessed through the word lines and bit lines electrically connected thereto.

DRAM fabrication has been a high competitive business. New and effective structural design/arrangement that enables the achievement of higher degree of integration in a DRAM device is thus imperative for gaining a competitive edge. Like the advancement in electronic device miniaturization, the fabrication technology/technique thereof has also evolved to enable the manufacture of smaller and higher quality transistors underlying these miniature electronic devices.

SUMMARY OF THE INVENTION

The embodiment of the instant disclosure provides a dynamic random access memory unit and the fabrication method thereof. The dynamic random access memory unit has a self-aligned trench isolation structure formed in the bottom portion of the trench of the substrate. Such arrangement results in an increase in device density.

The dynamic random access memory unit in accordance with the instant disclosure comprises a substrate, a self-aligned trench isolation structure, and a first trenched gate. The substrate has a trench disposed therein. The self-aligned trench isolation structure is formed in the bottom portion of the trench. The first trenched gate is formed in the bottom portion of the trench and above the self-aligned trench isolation structure.

The substrate includes at least one pillar-shaped active body, which has a drain region of a first conductivity type, a body region of a second conductivity type opposite to the first conductivity type, and a source region of the first conductivity type. The body region is arranged atop the drain region, and the source region is arranged atop the body region. The first trenched gate includes a first spacer formed on the side-wall in the bottom portion of the trench to selectively cover and surround the portion of the side-wall in the trench that comprises the drain region, such for defining the width of the self-aligned trench isolation structure.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims, the invention itself, however, as well as a preferred mode of use, further objectives and advantages thereof, will best be understood by reference to the following detailed description of an illustrative embodiments when read in conjunction with the accompanying drawings, wherein:

DETAILED DESCRIPTION OF THE PREFERRED EMBODIMENTS

The instant disclosure will be described more specifically with reference to the following embodiments. It is to be noted that the following descriptions of preferred embodiments are provided herein for purpose of illustration and description. It is not intended to be exhaustive or limiting to the precise form disclosed.

Figure 5:
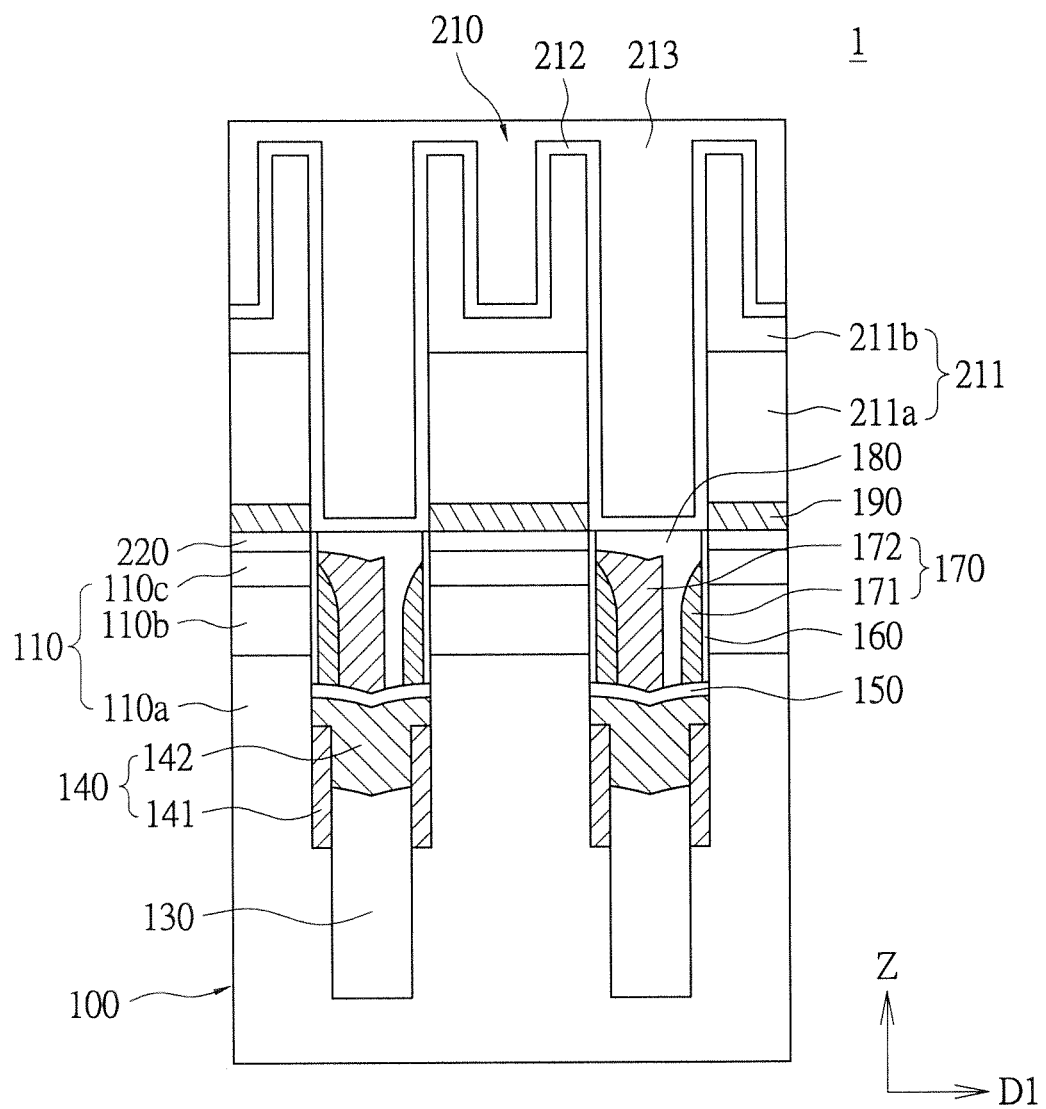
FIG. 5 illustrates a partial cross-sectional view of the dynamic random access memory structure in accordance with an embodiment of the instant disclosure.

Please refer to FIG. 5, which illustrates a partial cross-sectional view of a dynamic random access memory structure in accordance with an embodiment of the instant disclosure. As shown in FIG. 5, the dynamic random access memory structure 1 includes a plurality of dynamic random access memory units 10. Each of the dynamic random access memory units 10 includes a substrate 100, a self-aligned trench isolation structure 130, a first trenched gate 140, a first cover layer 150, a gate dielectric layer 160, and a second trenched gate 170. The substrate 100 includes at least one pillar-shaped active body 110 and has a trench 120 disposed therein. The self-aligned trench isolation structure 130 and the first trenched gate 140 are both formed in the bottom portion of the trench 120, where the first trenched gate 140 is arranged above the self-aligned trench isolation structure 130. The first cover layer 150, which is formed in the trench 120 to cover the first trenched gate 140, is arranged between the first trenched gate and the second trenched gate. The gate dielectric layer 160 is covering the side-wall in the upper portion of the trench 120. The second trenched gate 170 is formed in the upper portion of the trench 120 such that the gate dielectric layer 160 is disposed between the second trenched gate 170 and the pillar-shaped active body 110.

The pillar-shaped active body 110 has a drain region 110a of a first conductivity type, a body region 110b of a second conductivity type opposite to the first conductivity type, and a source region 110c of the first conductivity type. The body region 110b is arranged atop the drain region 110a, and the source region 110c is arranged atop the body region 110b.

The trench 120, which is penetratively disposed in the substrate 100, extends to the bottom of the drain region 110a, and the self-aligned trench isolation structure 130 formed in the bottom portion of the trench 120 extends to the bottom of the drain region 110a for providing electrical insulation between the neighboring pillar-shaped active bodies 110. Specifically, the self-aligned trench isolation structure 130 may include an oxide liner disposed on the inner walls that defines the trench 120, a silicon nitride liner disposed on the oxide liner, a spin-on dielectric layer disposed on the silicon nitride liner and substantially filling the bottom portion of the trench 120, and a high-density plasma layer disposed on the spin-on dielectric layer.

The first trenched gate 140 includes a first spacer 141 and a first conductive layer 142. The first spacer 141 is formed on the side-wall in the bottom portion of the trench 120 to selectively cover and surround the portion of the side-wall in the trench 120 that comprises the drain region 110a, such for defining the width of the self-aligned trench isolation structure 130 (i.e., the lateral distance between two side-surfaces of the self-aligned trench isolation structure 130, as shown in FIG. 5). In the instant disclosure, the first spacer 141 is attached to the drain region 110a (where an attaching side-surface of the first spacer 141 is flush with the portion of the side-wall in the trench 120 that comprises the drain region 110a) and in electrical connection with the drain region 110a. As shown in FIG. 5, the side-surface of the self-aligned trench isolation structure 130 is flush with an exposed side-surface of the First spacer 141. which is opposite to the attaching side-surface of the first spacer 141. The first conductive layer 142 selectively covers the surface of the first spacer 141.

Figure 10:
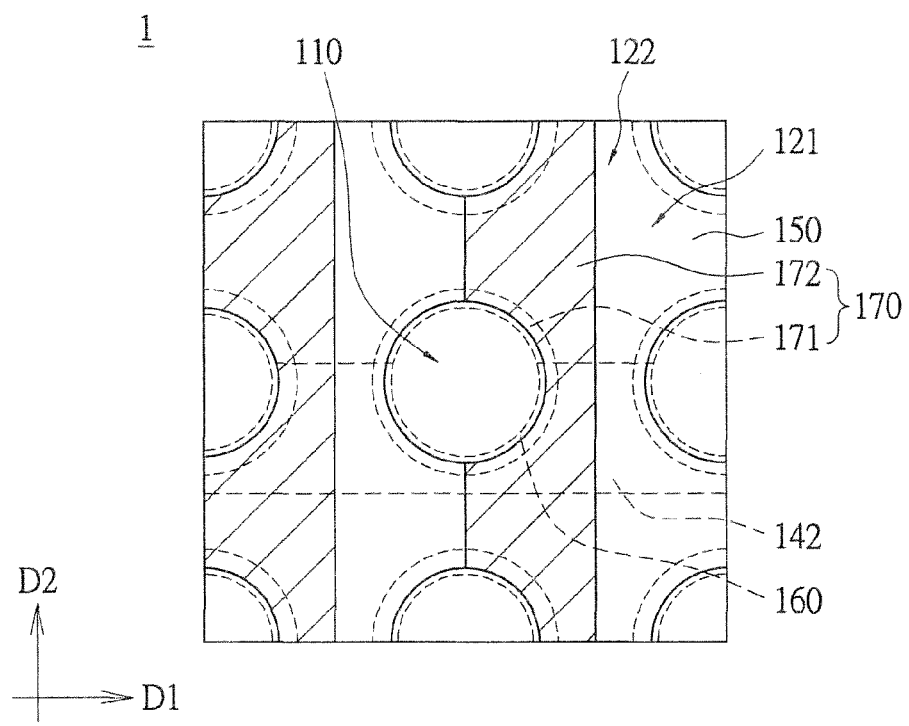

The second trenched gate 170 includes a second spacer 171 and a second conductive layer 172. The second spacer 171 is formed on the side-wall in the upper portion of the trench 120 to selectively cover and surround the portion of the side-wall in the trench 120 that comprises the source region 110c, the body region 110b, and the portion of the drain region 110a adjacent to the body region 110b. Specifically, the upper portion of the second spacer 171 is surrounding the portion of the side-wall in the trench 120 that comprises the portion of the source region 110c adjacent to the body region 110b. The bottom portion of the second spacer 171 is surrounding the portion of the side-wall in the trench 120 that comprises the portion of the drain region 110a adjacent to the body region 110b. The second conductive layer 172 selectively covers the surface of the second spacer 171. The first conductive layer 142 and the second conductive layer 172 form a crossing pattern, in which the first conductive layer 142 extends along a first direction D1 (FIG. 8), and the second conductive layer extends along a second direction D2 (FIG. 10).

Each of the dynamic random access memory units 10 further includes a second cover layer 180, a conductive pad 190, and a stacked capacitor structure 210. The second cover layer 180 is covering the second trenched gate 170. The conductive pad 190 is disposed on the pillar-shaped active body 110. The stacked capacitor structure 210 is disposed on the conductive pad 190. In the instant embodiment, the conductive pas 190 can be attached to and in electrical connection with the source region 110c, and the stacked capacitor structure 210 is in electrical connection with the source region 110c via the conductive pad 190. The stacked capacitor structure 210 includes a bottom electrode 211, an upper electrode 213, and a capacitor dielectric layer 212. The bottom electrode 211 includes a pillar-shaped lower portion 211a, formed on the conductive pad 190, and a crown-shaped upper portion 211b, formed on the lower portion 211a. The capacitor dielectric layer 212 provides electrical insulation between the bottom electrode 211 and the upper electrode 213.

Suitable material for the first spacer 141, the first conductive layer 142, the second spacer 171, and the second conductive layer 172 includes conductors such as tungsten and polysilicon. Suitable material for the first cover layer 150 and the second cover layer 180 includes electrically insulators such as silicon oxide.

It is worth mentioning that, in the dynamic random access memory structure 1 of the instant embodiment, the substrate 100 comprises an array of the pillar-shaped active bodies 110 (referred to as the active array), and the trench 120 in the substrate 100 has a plan view that resembles the shape of a crossing net. Structurally, the active array is formed by a plurality of crossingly arranged columns of the active bodies 110 and rows of the active bodies 110. The first conductive layers 142 in the same row of the active bodies 110 are in electrically connection with each other, serving as an embedded bit line of the dynamic random access memory structure 1, which is extending along the first direction D1. The first conductive layers 142 in any of the rows of the active bodies 110 are electrically insulated from those in others of the rows of the active bodies 110, whereby the embedded bit lines can control the corresponding rows of the active bodies 110 respectively. Each of the first spacers 141 surrounding the pillar-shaped active body 110 serves as a contacting layer for providing the electrical connection between the pillar-shaped active body 110 and the embedded bit line, enabling access to the drain region 110a.

In addition, the second conductive layers 172 in the same column of the active bodies 110 are in electrically connection with each other, serving as a embedded word line of the dynamic random access memory structure 1, which is extending along the second direction D2. The second conductive layers 172 in any of the columns of the active bodies 110 are electrically insulated from those in others of the columns of the active bodies 110, whereby the embedded word lines can control the corresponding columns of the active bodies 110 respectively. Each of the embedded word lines may establish process to the pillar-shaped active body 110 via the second spacer 171, enabling the current/carriers to flow in the body region 110b from the drain region 110a to the source regions 110c, eventually to the stacked capacitor structure 210 formed on the pillar-shaped active body 110.

In accordance with the instant embodiment, the present disclosure provides a dynamic random access memory unit 10 having a surrounding first spacer 141 and a vertical transistor structure (including, as a specific example, the pillar-shaped active body 100 having the vertical arrangement of the source region 110c, the body region 110b, and the drain region 110a, and the second spacer 171 of the second trenched gate 17 surrounding the pillar-shaped active body 100). Moreover, the width of the self-aligned trench isolation structure 130, which is arranged underneath the surrounding first spacer 141, is defined by the first spacer 141. Through such arrangement, the depth of the self-aligned trench isolation structure 130 (i.e., the vertical distance from the bottom inner surface of the trench 120 to the surface of the substrate 100, as shown in FIG. 5) is not limited by the lateral dimension of the trench 120, the resolution or the tolerance of the aligning control of the available lithography process, or the lateral dimension of the self-aligned trench isolation structure 130, thus to provide the electrical insulation between the neighboring vertical transistor structures. In addition, the embedded /buried world line, the embedded /buried bit line, the vertical transistor structure, and the self-aligned trench isolation structure 130 may facilitate the vertical dimension of the isolation structures and enable the dynamic random access memory structure 1 to resume an increase in the device density.

The following description describes the fabrication method of a dynamic random access memory structure in accordance the instant disclosure. In the context of this document, the terms "atop", "underneath", "above", "upper", and "bottom" are defined with respect to the horizontal plane, which is refer to any plane substantially in parallel with the primary surface of the semiconductive substrate and the surface of the substrate 100, regardless of the orientation thereof, and the term "vertical" refers to the direction that substantially in parallel with the normal to the horizontal plane.

Figure 11:
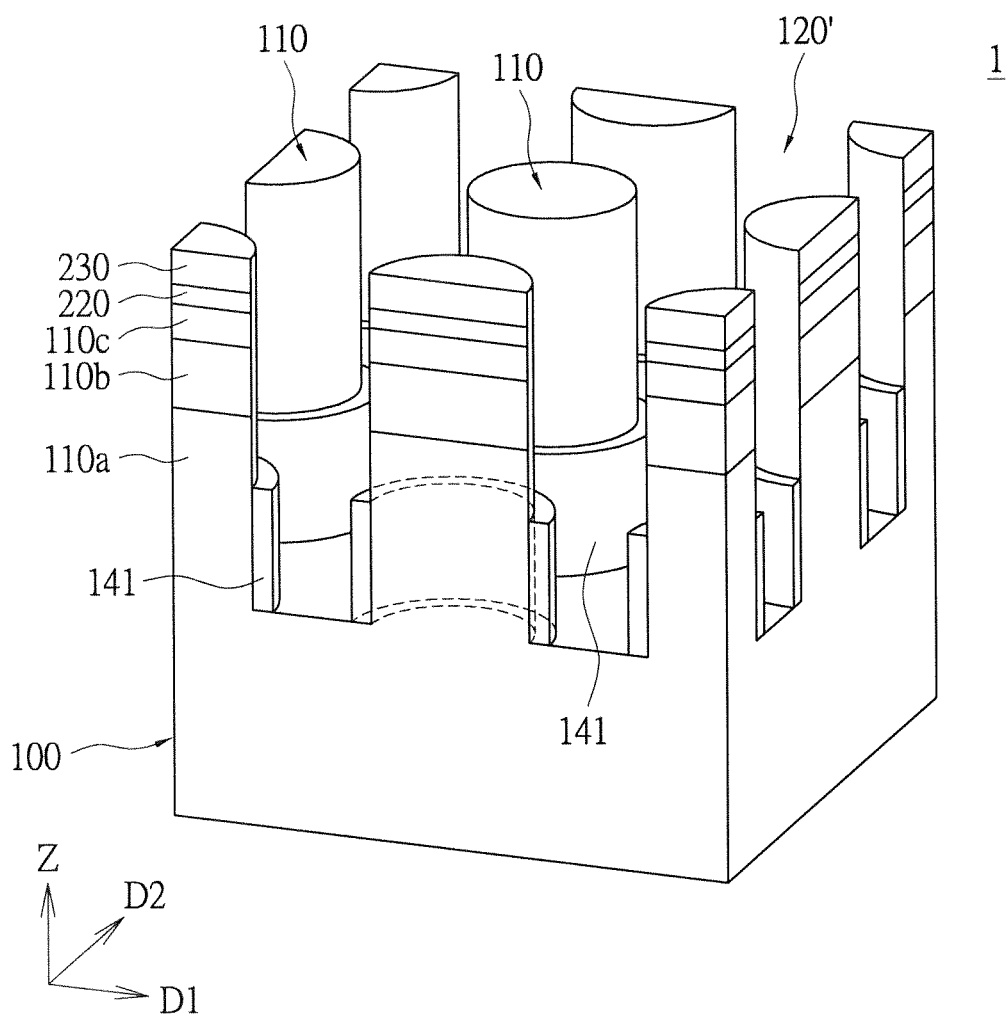
FIG. 11 to FIG. 13 respectively illustrates a partial perspective view of the dynamic random access memory structure during one exemplary fabrication step.
Figure 12:
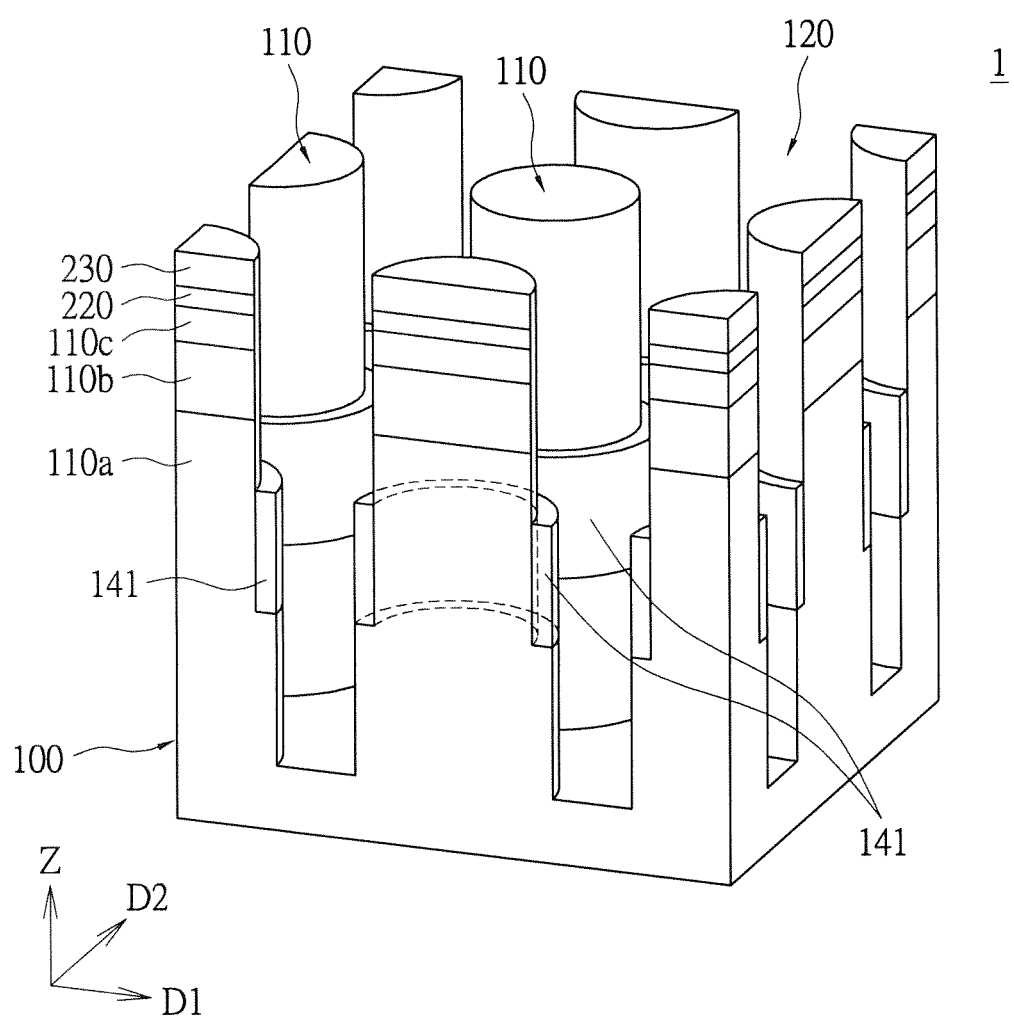
Figure 13:
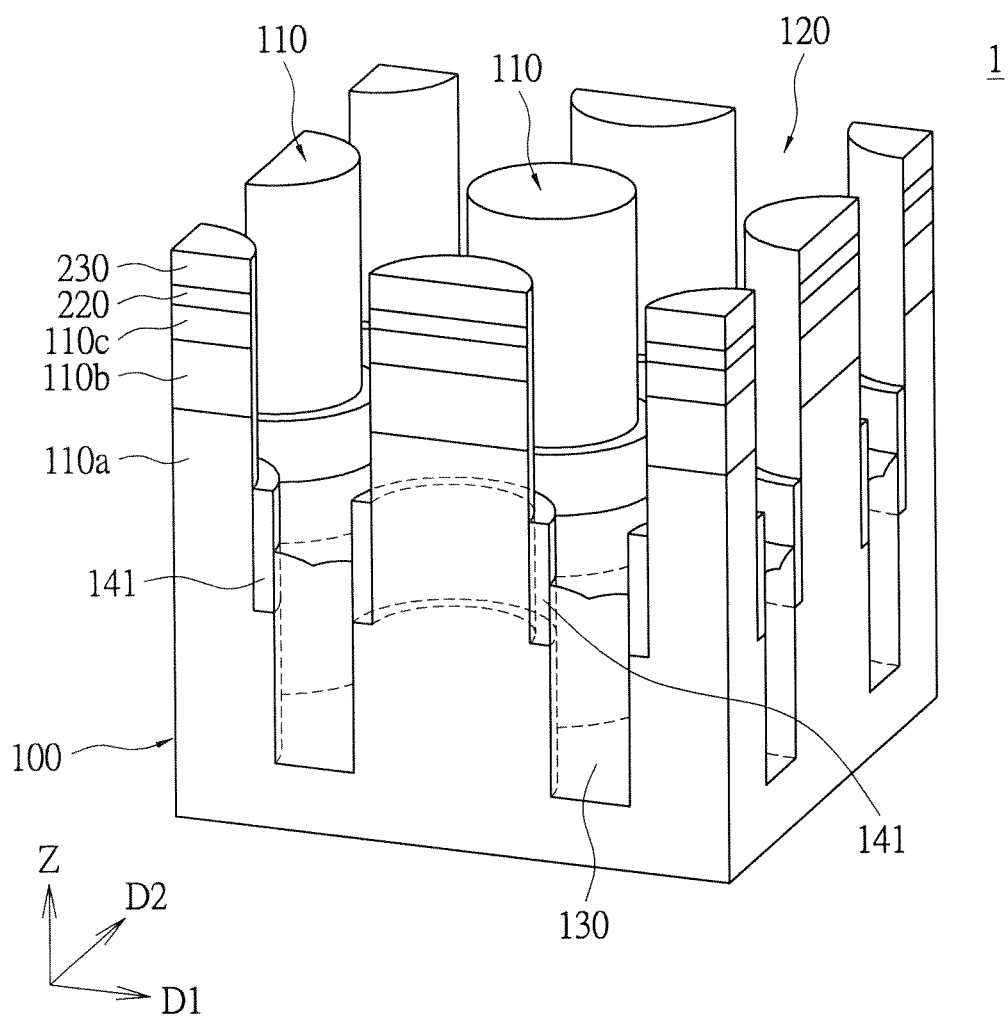

The fabrication method of a dynamic random access memory structure in accordance the instant disclosure will be understood by the following description when read in conjunction with the accompanying drawings, wherein: FIG. 1 to FIG. 4 respectively illustrates a partial cross-sectional view of a dynamic random access memory structure during one exemplary fabrication step: FIG. 6 to FIG. 10 respectively illustrates a regional plan view of the dynamic random access memory structure during one exemplary fabrication step; FIG. 11 to FIG. 13 respectively illustrates a partial perspective view of the dynamic random access memory structure during one exemplary fabrication step.

Figure 1:
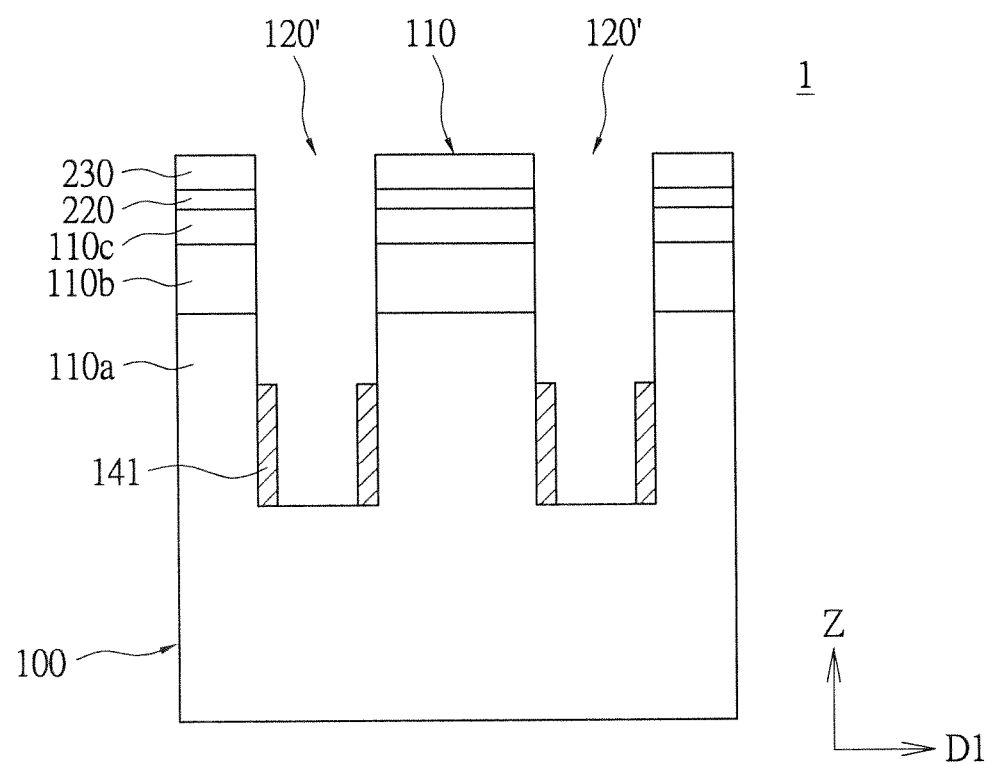
FIG. 1 to FIG. 4 respectively illustrates a partial cross-sectional view of a dynamic random access memory structure during one exemplary fabrication step.

Please refer concurrently to FIG. 1 and FIG. 11, wherein FIG. 11 is corresponding to FIG. 1. In the fabrication method of the dynamic random access memory structure 1, which may include a plurality of dynamic random access memory unit 10, a substrate 100 having at least one pillar-shaped active body 110 is first provided. The pillar-shaped active body 110 has a drain region 110a of a first conductivity type, a body region 110b of a second conductivity type opposite to the first conductivity type, and a source region 1 10c of the first conductivity type. The body region 110b is arranged atop the drain region 110a, and the source region 110c is arranged atop the body region 110b.

Specifically, the step of providing the substrate 100 may comprises: providing a semiconductive substrate of the first conductive type, and subsequently disposing a epitaxial layer of the first conductive type on the semiconductive substrate to form the drain region 110a; forming the body region 110b of the second conductive type on the drain region 110a; eventually forming the source region 110c of the first conductive type on the body region 110b.

Next, a lithography process and an etching process are carried out to define a pattern that corresponds to the location of the pillar-shaped active body 110 and form a trench 120' in the substrate 100. As sown in FIG. 1 or FIG. 11, the trench 120' is adjacent to the pillar-shaped active body 110, and the side-surface of the pillar-shaped active body 110 is exposed in the trench 120'. The depth of the body region 110b is smaller than that of the trench 120', and the bottom inner surface of the trench 120' is located at the drain region 110a, which is below the body region 110b. In the instant disclosure, a polysilicon layer 220 and a silicon nitride layer 230 may be preferably disposed on the pillar-shaped active body 110.

It is worth noting that, in the dynamic random access memory structure 1 of the instant embodiment, the substrate 100 comprises an array of the pillar-shaped active bodies 110 (referred to as the active array), and the trench 120' in the substrate 100 has a plan view that resembles the shape of a crossing net. Structurally. the active array is formed by a plurality of crossingly arranged columns of the active bodies 110 and rows of the active bodies 110, and the trench 120' includes a plurality of crossingly arranged first channels 121 and second channels 122, where the first channels 121 each extend along the first direction D1, and the second channels 122 each extend along the second direction D2.

Next, a first spacer 141 is formed on the side-wall in the bottom portion of the trench 120'. Suitable material for the first spacer 141 includes conductors such as tungsten and polysiliscon. Specifically, the formation of the first spacer 141 may comprise: firstly, conductive material is disposed into the bottom portion of the trench 120' to form a conductive material layer conformally covering the inner surface that define the bottom portion of the trench 120'; etching is then carried out to selectively remove the conductive material from the bottom portion of the trench 120', thereby forming the first spacer 141. The first spacer 141 is selectively covering and surrounding the portion of the side-wall in the trench 120' that comprises the drain region 110a. Moreover, the first spacer 141 is attached to the drain region 110a (where an attaching side-surface of the first spacer 141 is flush with the portion of the side-wall in the trench 120' that comprises the drain region 110a) and in electrical connection with the drain region 110a.

Figure 2:
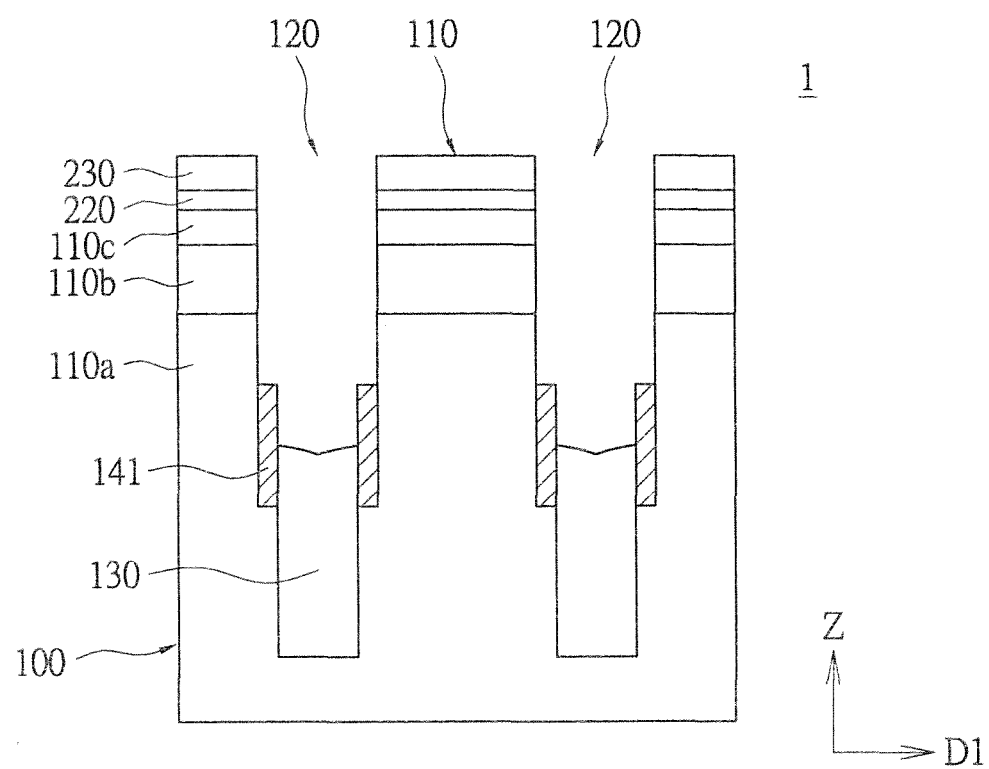

Please refer to FIG. 12. Through use of the first spacer 141 as a mask, etching is performed on the portion of the substrate 100 that corresponds to the bottom portion of the trench 120', thereby extending/increasing the depth of the trench 120' downward into the bottom of drain region 110a. As shown in FIG. 2, the deepened trench 120 has a stepped side-wall, where the lateral dimension of the portion of the trench 120 that is located below the first spacer 141 is smaller than that of the portion of the trench 120 that is located above the first spacer 141. In addition, the portion of the side-wall in the trench 120 that is located below the first spacer 141 is flush with an exposed side-surface of the first spacer 141, which is opposite to the attaching side-surface of the first spacer 141.

Figure 6:
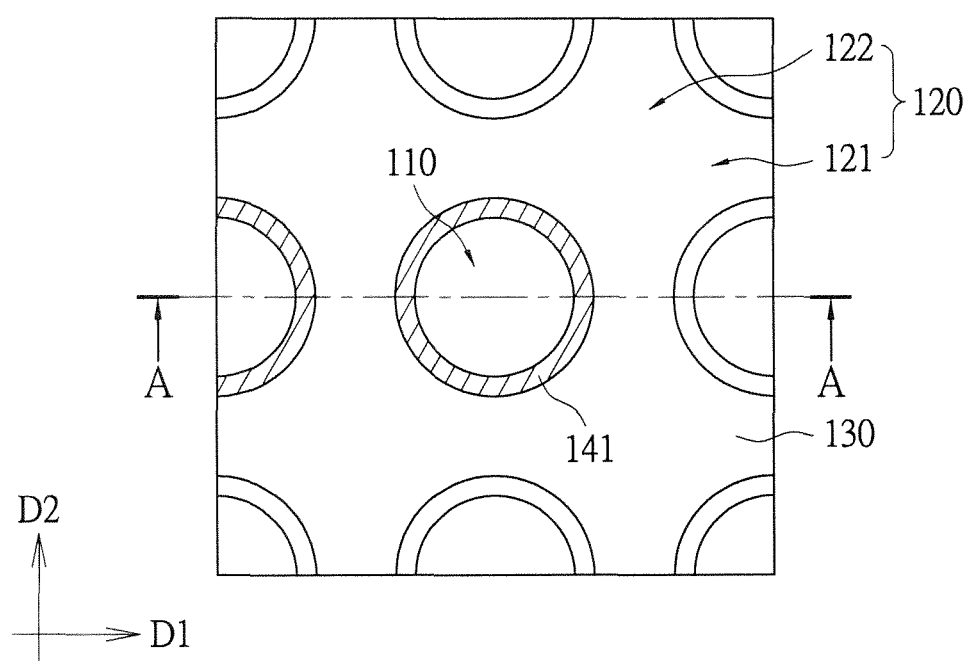
FIG. 6 to FIG. 10 respectively illustrates a regional plan view of the dynamic random access memory structure during one exemplary fabrication step.

Please refer concurrently to FIG. 2, FIG. 6 and FIG. 13, wherein FIG. 6 and FIG. 13 are corresponding to FIG. 2. Insulating material is then disposed into the trench 120, thereby forming a self-aligned trench isolation structure 130 in the bottom portion of the deepened trench 120, where the width of the self-aligned trench isolation structure 130 is defined by the first spacer 141. In the instant disclosure, the self-aligned trench isolation structure 130 may extend to the bottom of the drain region 110a, and the side-surface of the self-aligned trench isolation structure 130 is flush with the exposed side-surface of the first spacer 141. The first spacers is located above the self-aligned trench isolation structure 130, that is, at least portions of the surface of the first spacer 141 is not covered by the insulating material of the self-aligned trench isolation structure 130. The formation of the self-aligned trench isolation structure 130 may comprise: sequentially disposing insulating materials in the form of oxide liner, silicon nitride liner, spin-on layer, and high-density plasma layer into the bottom portion of the deepened trench 120.

In the instant disclosure, the trench 120 is deepened by etching on the portion of the substrate 100 that corresponds to the bottom portion of the trench through use of the first spacer 141 as a mask, thereby defining the width and the depth of self-aligned trench isolation structure 130. Therefore, the trench isolation structure 130 can be formed by self aligning instead of lithography process, thus to avoid the inconvenience in the aligning control during the lithography process and to resume a smaller width of the trench 120/120'.

Figure 3:
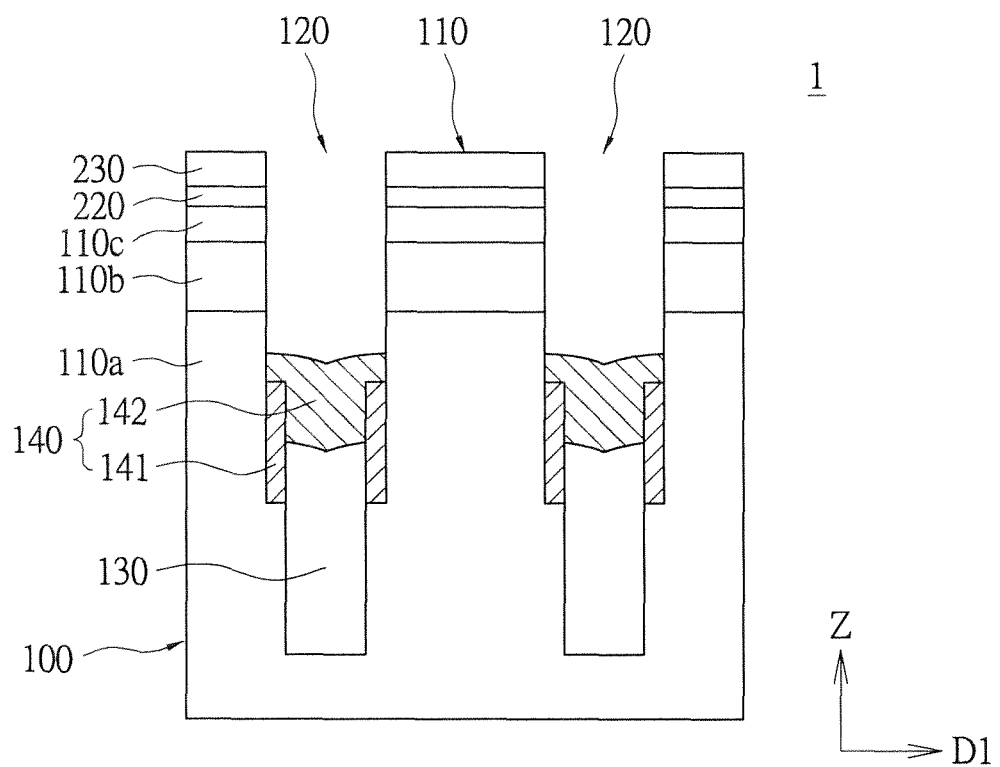
Figure 7:
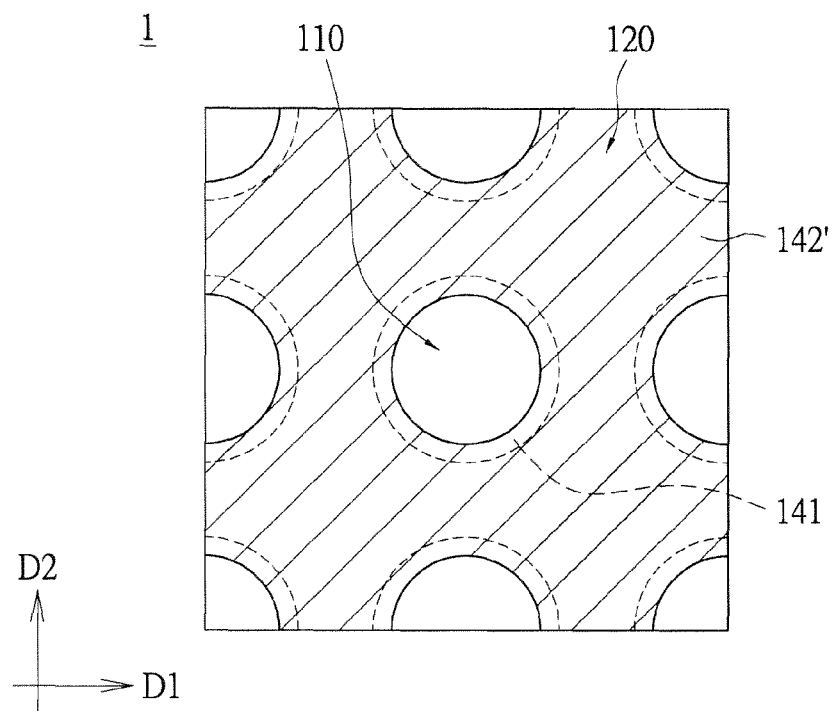

Please refer concurrently to FIG. 3 and FIG. 7, wherein FIG. 7 is corresponding to FIG. 3. A first conductive initial layer 142' is disposed into the bottom portion of the trench 120 to cover the first spacer 141, where the first conductive initial layer 142' is attached to the exposed surface of the First spacer 141 and in electrical connection with the first spacer 141. Specifically, the formation of the first conductive initial layer 142' may comprise the steps of: performing a deposition of conductive material on the substrate 100; chemical mechanical polishing; and etching back.

Figure 8:
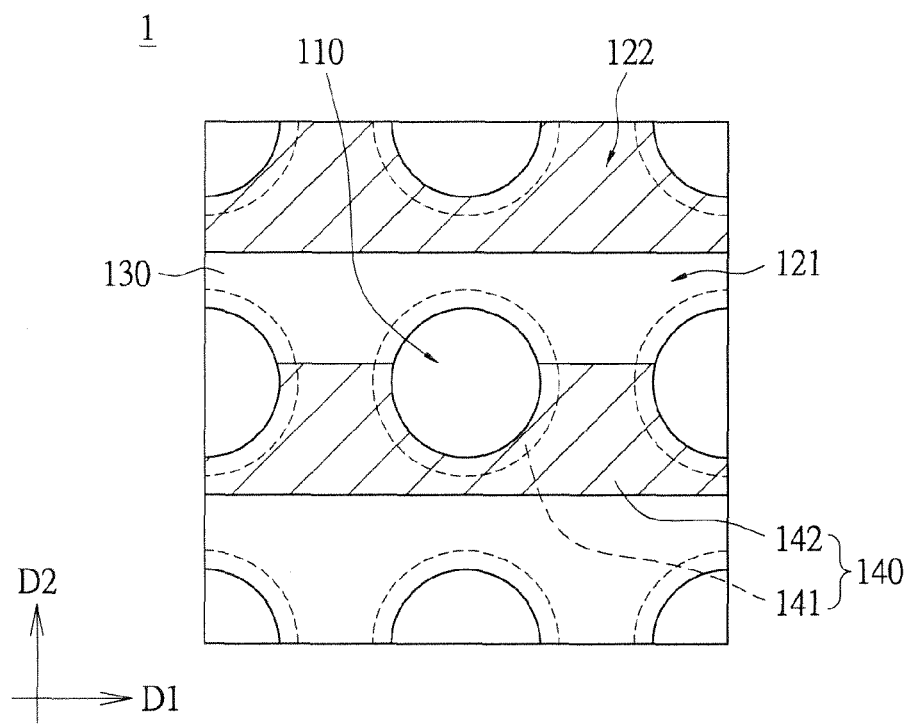

Please refer concurrently to FIG. 7 and FIG. 8. Next, in the following steps, the first conductive initial layer 142' is patterned along the first direction D1, forming embedded bit lines, which are correspondingly arranged in the rows of the active bodies 110 and electrically insulated from one another. Specifically, the patterning process may comprise the steps of: firstly, an insulator layer (not shown in the Figures) is disposed in the trench 120 to cover the first conductive initial layer 142'; chemical mechanical polishing is carried out: the insulator layer is then patterned through a lithography process, to define a pattern with openings each extending along the first direction D1; through the use of the patterned insulator layer as a mask, etching process is carried out on the first conductive initial layer 142' at locations that corresponds to the first channels 121, for exposing the portion of the self-aligned trench isolation structure 130 that is disposed in the first channels 121; removing the patterned insulator layer. Through performing the these steps, the first conductive initial layer 142' is disconnected at locations that corresponds to the first channels 121, forming a plurality of first conductive layers 142, which each extend along the first direction D1, where the conductive layers 142 each are selectively attached to the surface of the corresponding first space 141. The first conductive layers 142 in the same row of the active bodies 110 are in electrically connection with each other, serving as one of the embedded bit lines of the dynamic random access memory structure 1. The formation of a first trenched gate 140 in the corresponding dynamic random access memory unit 10 is generally completed upon the formation of the first conductive layer 142, where the first trenched gate 140 includes the first spacer 141 and the first conductive layer 142 in electrical connection therewith.

Figure 4:
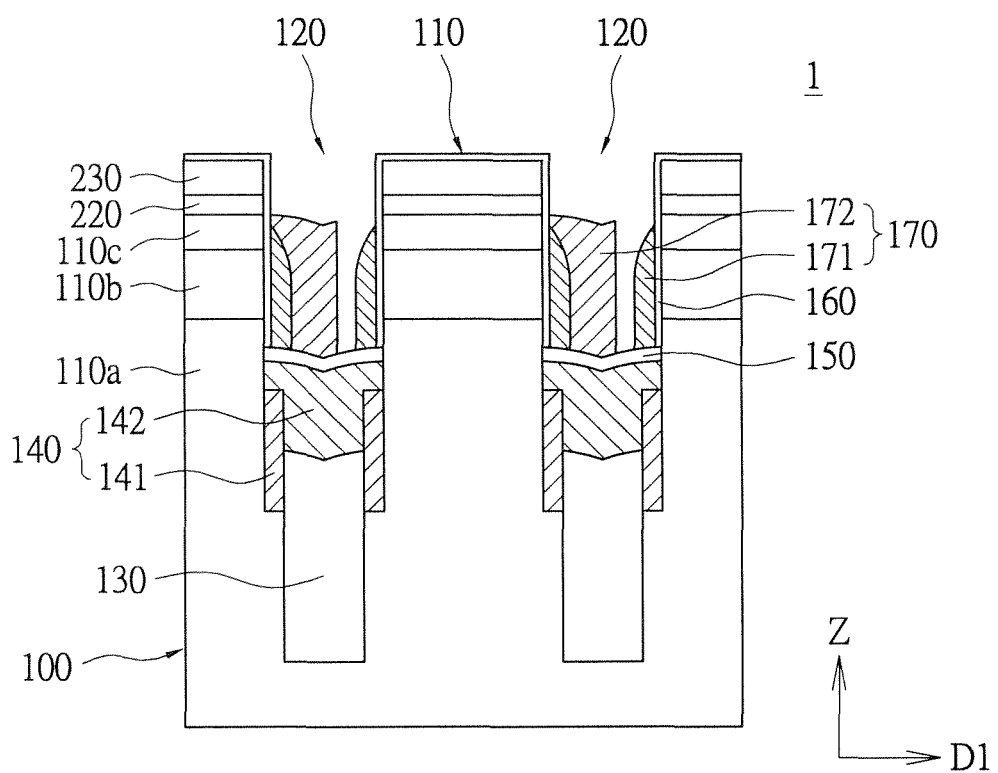

Please refer to FIG. 4. After the bit lines are formed, a first cover layer 150 is formed in the trench 120 to cover the first trenched gate 140. The formation of the first cover layer 150 may comprise: a insulator material (not shown in the figures) such as silicon oxide is disposed on the substrate 100 to fill into the trench 120; chemical mechanical polishing; and etching the insulator material back to the predetermined depth, where portions of the surface of the drain region 110c is exposed.

Please refer again to FIG. 4. A gate dielectric layer 160 is subsequently formed to conformally cover the inner surface that defines the upper portion of the trench 120 by performing an oxidation process. Next, a second spacer 171 is formed on the side-wall in the upper portion of the trench 120. Suitable material for the second spacer 171 includes conductors such as tungsten and polysiliscon. Specifically, the formation of the second spacer 171 may comprise: firstly, conductive material is disposed into the upper portion of the trench 120 to form a conductive material layer conformally covering the inner surface that defines the upper portion of the trench 120; etching is then carried out to selectively remove the conductive material from the surface of the first cover layer 160, thereby forming the second spacer 171. The second spacer 171 is selectively covering and surrounding the portion of the side-wall in the trench 120 that comprises the source region 110c. the body region 110b. and the portion of the drain region 110a adjacent to the body region 110b. Specifically, the upper portion of the second spacer 171 is surrounding the portion of the side-wall in the trench 120 that comprises the portion of the source region 110c adjacent to the body region 110b. The bottom portion of the second spacer 171 is surrounding the portion of the side-wall in the trench 120 that comprises the portion of the drain region 110a adjacent to the body region 110b.

Figure 9:
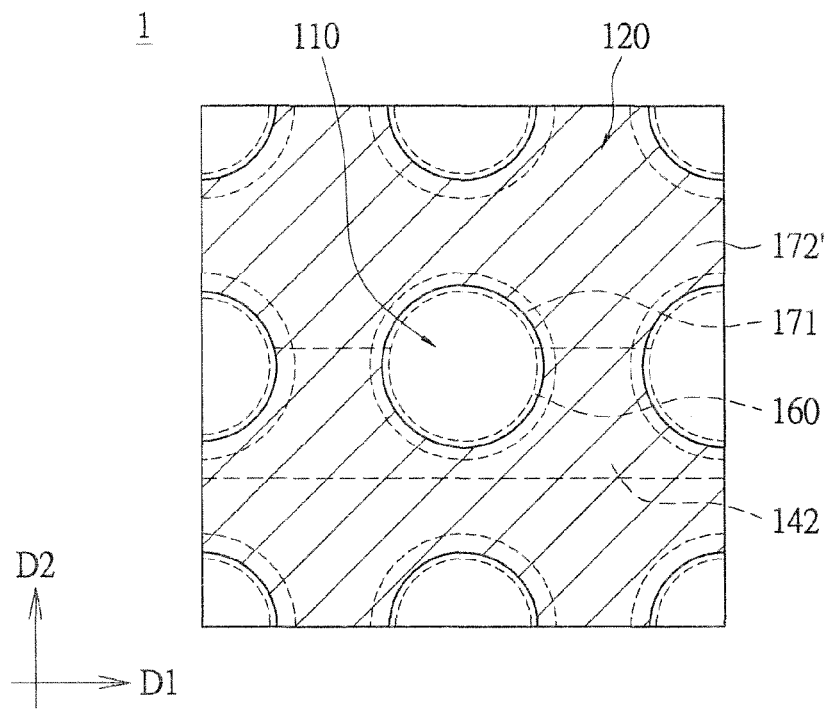

Please refer concurrently to FIG. 4 and FIG. 9. A second conductive initial layer 172' is disposed into the upper portion of the trench 120 to cover the second spacer 171, where the second conductive initial layer 172' is attached to the exposed surface of the second spacer 171 and in electrical connection with the second spacer 171. Specifically, the formation of the second conductive initial layer 172' may comprise the steps of: performing a deposition of conductive material on the substrate 100; chemical mechanical polishing; and etching back.

Please refer concurrently to FIG. 9 and FIG. 10. Next, in the following steps, the second conductive initial layer 172' is patterned along the second direction D2, forming embedded word lines, which are correspondingly arranged in the columns of the active bodies 110 and electrically insulated from one another. Specifically, the patterning process may comprise the steps of: firstly, an insulator layer (not shown in the Figures) is disposed in the trench 120 to cover the second conductive initial layer 172'; chemical mechanical polishing is carried out: the insulator layer is then patterned through a lithography process, to define a pattern with openings each extending along the second direction D2; through the use of the patterned insulator layer as a mask, etching process is carried out on the second conductive initial layer 172' at locations that corresponds to the second channels 122, for exposing the portion of the self-aligned trench isolation structure 130 that is disposed in the second channels 122; removing the patterned insulator layer. Through performing the these steps, the second conductive initial layer 172' is disconnected at locations that corresponds to the second channels 122, forming a plurality of second conductive layers 172, which each extend along the second direction D2, where the conductive layers 172 each are selectively attached to the surface of the corresponding second space 171. The second conductive layers 172 in the same column of the active bodies 110 are in electrically connection with each other, serving as one of the embedded word lines of the dynamic random access memory structure 1. The formation of a second trenched gate 170 in the corresponding dynamic random access memory unit 10 is generally completed upon the formation of the second conductive layer 172, where the second trenched gate 170 includes the second spacer 171 and the second conductive layer 172 in electrical connection therewith.

Please refer to FIG. 5. Next, a second cover layer 180 is disposed into the trench 120 to cover the second trenched gate 170. The silicon nitride layer 230 is then removed. Subsequently. a conductive pad 190 is formed on the pillar-shaped active body 130. Lastly, a stacked capacitor structure 210 is formed on the conductive pad 190, where the conductive pas 190 is in electrical connection with the source region 110c via the conductive pad 190. The stacked capacitor structure 210 includes a bottom electrode 211, an upper electrode 213, and a capacitor dielectric layer 212. The bottom electrode 211 includes a pillar-shaped lower portion 211a, formed on the conductive pad 190, and a crown-shaped upper portion 211b, formed on the lower portion 211a. The capacitor dielectric layer 212 provides electrical insulation between the bottom electrode 211 and the upper electrode 213. The formation of the dynamic random access memory structure 1 is generally completed upon the formation of the stacked capacitor structure 210.

In the instant embodiment, the embedded /buried world line, the embedded/buried bit line, the vertical transistor structure, and the self-aligned trench isolation structure 130 may facilitate the planarization on the structure surface thereof, thus increase usable area on the substrate 100 and enable easier deposition of stacked capacitor structure thereon. In the above mentioned step of forming the stacked capacitor structure 210, local interconnection of the device may be formed at the same time in the process of forming the pillar-shaped lower portion 211a of the bottom electrode 211.

Figure 14:
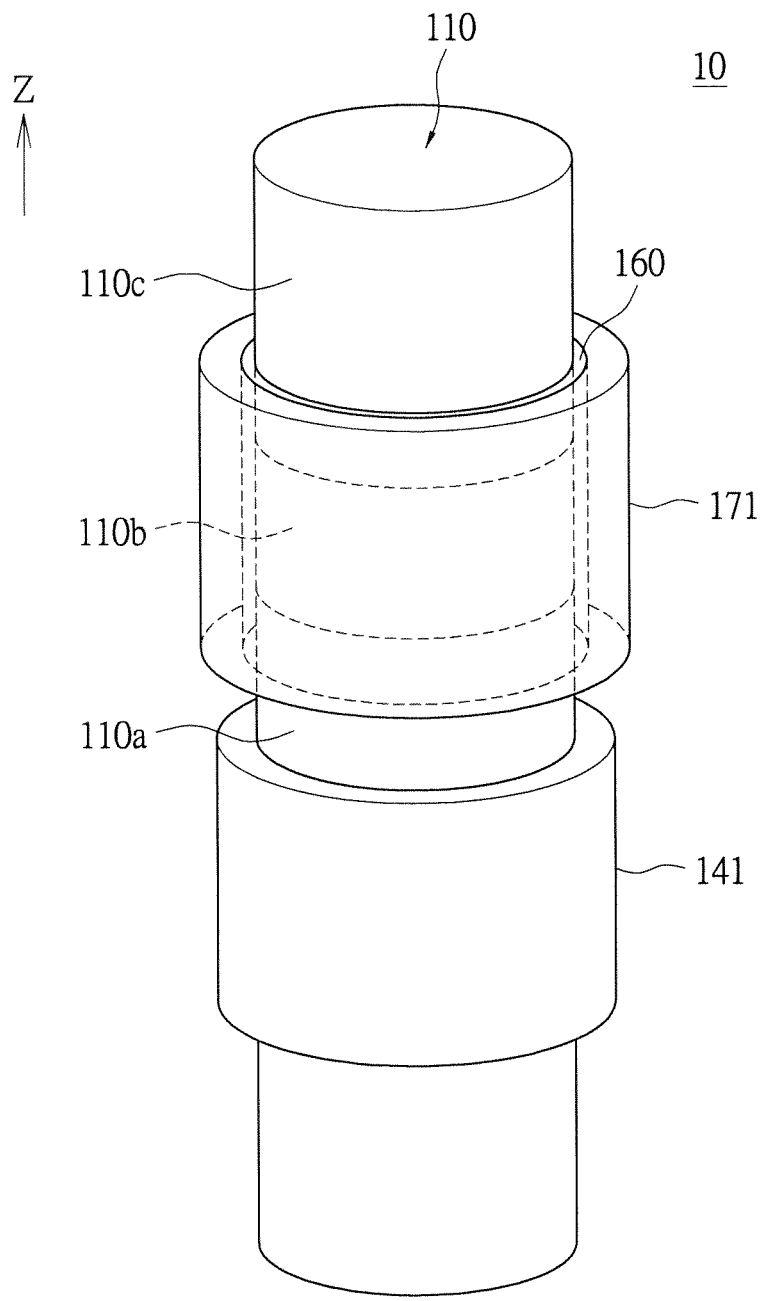
FIG. 14 illustrates a perspective view of a dynamic random access memory unit in accordance with an embodiment of the instant disclosure.

Please refer to FIG. 14, which illustrates a perspective view of a dynamic random access memory unit in accordance with an embodiment of the instant disclosure. As shown in FIG. 14, the dynamic random access memory unit 1 in accordance with one embodiment of the instant disclosure comprises a pillar-shaped active body 110, a first trenched gate 140, a second trenched gate 170, and a gate dielectric layer 160. The pillar-shaped active body 110 has a drain region 110a of a first conductivity type, a body region 110b of a second conductivity type opposite to the first conductivity type, and a source region 110c of the first conductivity type. The body region 110b is arranged atop the drain region 110a, and the source region 110c is arranged atop the body region 110b. The first trenched gate 140 includes a first spacer 141, which selectively surrounds the portion of the pillar-shaped active body 110 that comprises the drain region 110a. The second trenched gate 170 includes a second spacer 171, which selectively surrounds the portion of the pillar-shaped active body 110 that comprises the body region 110b, the portion of the source region 110c adjacent to the body region 110b, and the portion of the drain region 110a adjacent to the body region 110b. The gate dielectric layer 160 is arranged between the second trenched gate 170 and the pillar-shaped active body 110.

In accordance with the instant embodiment. the present disclosure provides a dynamic random access memory unit 10 having the surrounding first spacer 141, which serves as the contacting layer for providing the electrical connection between the pillar-shaped active body 110 and the embedded bit line, and the surrounding second spacer 171, whereby the embedded word lines may establish process to the vertical transistor structure via the second spacer 171 In addition, the width of the self-aligned trench isolation structure 130, which is arranged underneath the surrounding first spacer 141, is defined by the first spacer 141. Hence, the dynamic random access memory unit 10 may resume a smaller physical dimension, such as a dimension of 4F2 (2F×2F, F: minimum feature size) and the device density of the dynamic random access memory structure 1 can be promoted.

While the invention has been disclosed with respect to a limited number of embodiments, numerous modifications and variations will be appreciated by those skilled in the art. It is intended, therefore, that the following claims cover all such modifications and variations that may fall within the true spirit and scope of the invention.

What is claimed is:

1. A dynamic random access memory unit, comprising:
    a substrate, including at least one pillar-shaped active body and having a trench disposed in the substrate,
        wherein the pillar-shaped active body has a drain region of a first conductivity type, a body region of a second conductivity type opposite to the first conductivity type, and a source region of the first conductivity type,
            wherein the body region is arranged atop the drain region and the source region is arranged atop the body region;
    a self-aligned trench isolation structure, formed in the bottom portion of the trench; and
    a first trenched gate, formed in the bottom portion of the trench and above the self-aligned trench isolation structure,
        wherein the first trenched gate includes a first spacer,
            wherein the first spacer is formed on the side-wall in the bottom portion of the trench to selectively cover and surround the portion of the side-wall in the trench that comprises the drain region, such for defining the width of the self-aligned trench isolation structure.

2. The dynamic random access memory unit of claim 1, wherein the side-surface of the self-aligned trench isolation structure is flush with the side-surface of the first spacer.

3. The dynamic random access memory unit of claim 1, wherein the self-aligned trench isolation structure includes an oxide liner, a silicon nitride liner, a spin-on dielectric layer, and a high-density plasma layer.

4. The dynamic random access memory unit of claim 1, wherein the first trenched gate further includes a first conductive layer, the first conductive layer selectively covers the surface of the first spacer, and the dynamic random access memory unit further comprises:
    a second trenched gate, formed in the upper portion of the trench,
        wherein the second trenched gate includes a second spacer formed on the side-wall in the upper portion of the trench to selectively cover and surround the portion of the side-wall in the trench that comprises the source region, the body region, and the portion of the drain region adjacent to the body region; and
    a gate dielectric layer, covering the side-wall in the upper portion of the trench and arranged between the second trenched gate and the pillar-shaped active body.

5. The dynamic random access memory unit of claim 4, wherein the second trenched gate further includes a second conductive layer selectively covering the surface of the second spacer and forming a crossing pattern with the first conductive layer, the first conductive layer extends along a first direction, and the second conductive layer extends along a second direction.

6. The dynamic random access memory unit of claim 5, further including a first cover layer formed in the trench to cover the first trenched gate and arranged between the first trenched gate and the second trenched gate.

7. The dynamic random access memory unit of claim 6, further including:
    a second cover layer, covering the second trenched gate;
    a conductive pad, formed on the pillar-shaped active body; and
    a stacked capacitor structure, formed on the conductive pad.

8. A dynamic random access memory unit, comprising:
    a pillar-shaped active body, having a drain region of a first conductivity type, a body region of a second conductivity type, and a source region of the first conductivity type,
        wherein the body region is arranged atop the drain region, and the source region is arranged atop the body region;
    a first trenched gate, including a first spacer,
        wherein the first spacer selectively surrounds the portion of the pillar-shaped active body that comprises the drain region;

a second trenched gate, including a second spacer,
wherein the second spacer selectively surrounds the portion of the pillar-shaped active body that comprises the body region, the portion of the source region adjacent to the body region, and the portion of the drain region adjacent to the body region; and
a gate dielectric layer, arranged between the second trenched gate and the pillar-shaped active body.

9. The dynamic random access memory unit of claim 8, wherein the first trenched gate further includes a first conductive layer selectively covering the surface of the first spacer, the second trenched gate further includes a second conductive layer selectively covering the surface of the second spacer and forming a crossing pattern with the first conductive layer, the first conductive layer extends along a first direction, and the second conductive layer extends along a second direction.

\* \* \* \* \*